United States Patent
Gupta et al.

(10) Patent No.: US 7,405,586 B2
(45) Date of Patent: Jul. 29, 2008

(54) ULTRA LOW PIN COUNT INTERFACE FOR DIE TESTING

(75) Inventors: Sunil Gupta, Austin, TX (US); Reed Linde, El Dorado Hills, CA (US); Rich Fackenthal, Carmichael, CA (US)

(73) Assignee: Intel Corporation, Santa Clara, CA (US)

( * ) Notice: Subject to any disclaimer, the term of this patent is extended or adjusted under 35 U.S.C. 154(b) by 194 days.

(21) Appl. No.: 11/385,131

(22) Filed: Mar. 20, 2006

(65) Prior Publication Data

US 2007/0216438 A1    Sep. 20, 2007

(51) Int. Cl.
*G01R 31/26* (2006.01)
(52) U.S. Cl. .................... 324/765; 324/763; 714/734
(58) Field of Classification Search .............. None
See application file for complete search history.

(56) References Cited

U.S. PATENT DOCUMENTS

| | | | |
|---|---|---|---|
| 5,805,605 A | 9/1998 | Lee et al. | |
| 6,286,115 B1 * | 9/2001 | Stubbs | 714/718 |
| 6,551,844 B1 | 4/2003 | Eldridge et al. | |
| 7,259,582 B2 * | 8/2007 | Ong | 324/765 |
| 2002/0158271 A1 | 10/2002 | Kouchi et al. | |

FOREIGN PATENT DOCUMENTS

KR    1019980012169 A    4/1998

OTHER PUBLICATIONS

International Search Report and Written Opinion of the International Searching Authority Dated Aug. 16, 2007, International Application No. PCT/US2007/064306.

* cited by examiner

*Primary Examiner*—Minh N. Tang
(74) *Attorney, Agent, or Firm*—Blakely, Sokoloff, Taylor & Zafman LLP

(57) ABSTRACT

An apparatus, a method and a system to test a device. An input/output (I/O) block communicates with an external tester to receive test data and to send test result using first and second communication modes. A logic block parses the test data. A memory stores microcode from the parsed test data. The microcode contains a test program to test a circuit. A controller executes the test program.

24 Claims, 8 Drawing Sheets

ULTRA LOW PIN COUNT INTERFACE FOR DIE TESTING

BACKGROUND

1. Field of the Invention

Embodiments of the invention relate to the field of semiconductors, and more specifically, to device testing.

2. Description of Related Art

As the complexity of Integrated Circuits (ICs) increases, the costs of testing ICs have also increased. To address the problem, several testing methodologies have been developed including those using Design For Test (DFT) techniques and Automated Test Equipment (ATE). DFT methodology focuses on the design of Built-in Self Test (BIST) with internal circuitry. ATE methodology focuses on developing external test controllers with interface to the DUTs. In general, test using BIST is significantly faster than ATE, but it has limited fault coverage. ATE, on the other hand, achieves higher fault coverage but usually incurs longer test time.

One major problem in testing ICs is the Input/Output (I/O) communication between the external tester (e.g., ATE) and the Device Under Test (DUT). A high number of I/O pins for a DUT adds to the complexity of test interface hardware and procedure. Even for Low Pin Count (LPC) devices, this number may still be high, especially when multiple devices are tested at the same time.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is a technique to test a device. An I/O block communicates with an external tester to receive test data and to send test result using first and second communication modes. A logic block parses the test data. A memory stores microcode from the parsed test data. The microcode contains a test program to test a circuit. A controller executes the test program.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

One embodiment of the invention is a technique to test die using a combination of DFT and ATE. The technique provides an Ultra Low Pin Count (ULPC) interface for parallel device testing using tester-to-silicon methodology. The test interface is implemented in two layers: a Physical (PHY) layer and a Media Access Control (MAC) layer. The PHY layer includes the built-in test circuit in the die under test. The MAC layer includes the communication protocol between the tester and the die DFT.

The testing technique may provide parallel device test up to the full wafer testing. The devices under test may be any devices that support the ULPC interface, such as memory devices (e.g., flash memory).

Figure 1:
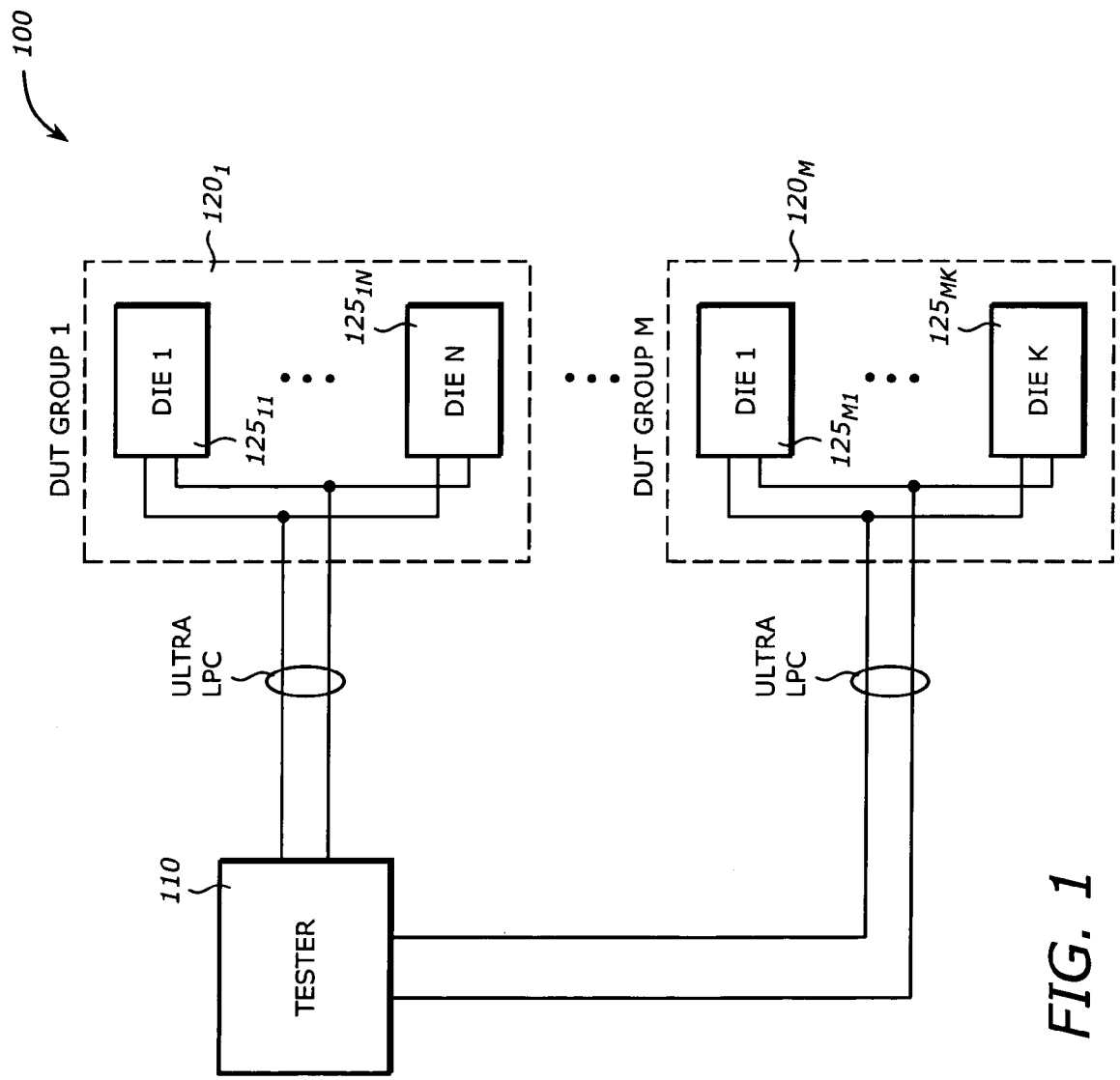
FIG. 1 is a diagram illustrating a system in which one embodiment of the invention can be practiced.

FIG. 1 is a diagram illustrating a system 100 in which one embodiment of the invention can be practiced. The system 100 includes a tester 110 and M DUT groups $120_1$ to $120_M$.

The tester 110 may be automated test equipment (ATE) to perform testing on the DUT groups $120_1$ to $120_M$. It may have a number of probes or contacts to connect to the DUT groups $120_1$ to $120_M$ via an ULPC interface.

The DUT groups $120_1$ to $120_M$ are groups of devices or dice under test. Each of the DUT groups $120_1$ to $120_M$ may represent a full wafer, a subset of the full wafer under test, or packaged parts. Each group has a number of devices or dies. For example, DUT group 1 $120_1$ may have N dice $125_{11}$ to $125_{1N}$. DUT group M $120_M$ may have K dice $125_{M1}$ to $125_{MK}$. The dice $125_{ij}$'s may be the same or different. They are ICs such as memory, flash memories, etc. The dice have ULPC interface which may include only two signals: a data signal and a dual-function signal. The data signal is a bi-directional signal. It may transfer test data (e.g., commands, microcode) from the tester 110 to the die 125. It may transfer test result or status from the die 125 to the tester 110. The dual-function signal serves two functions according to the communication mode. In one mode, the dual-function signal is used as a clock signal to clock the data. In another mode, it is used as a reference voltage signal, a precision current reference, or a precision voltage input to be used by the on-die test circuit when performing the analog test operations. The dice $125_{ij}$'s may share the same ULPC signals within the same group. This further reduces the I/O resources.

The tester 110 and the DUT groups $120_1$ to $120_M$ may communicate using any appropriate communication protocols. In one embodiment, the communication uses data packets. Each packet has a pre-defined packet format. Information may be extracted from the packets based on the packet format. The packets may include the identifier of the intended DUT recipient. The tester 110 may send packets to the dice using a broadcast mode where all dice in a group receives the same information. Alternatively, the tester 110 may send to individual dice with particular packets having the specific identifiers.

Figure 2:
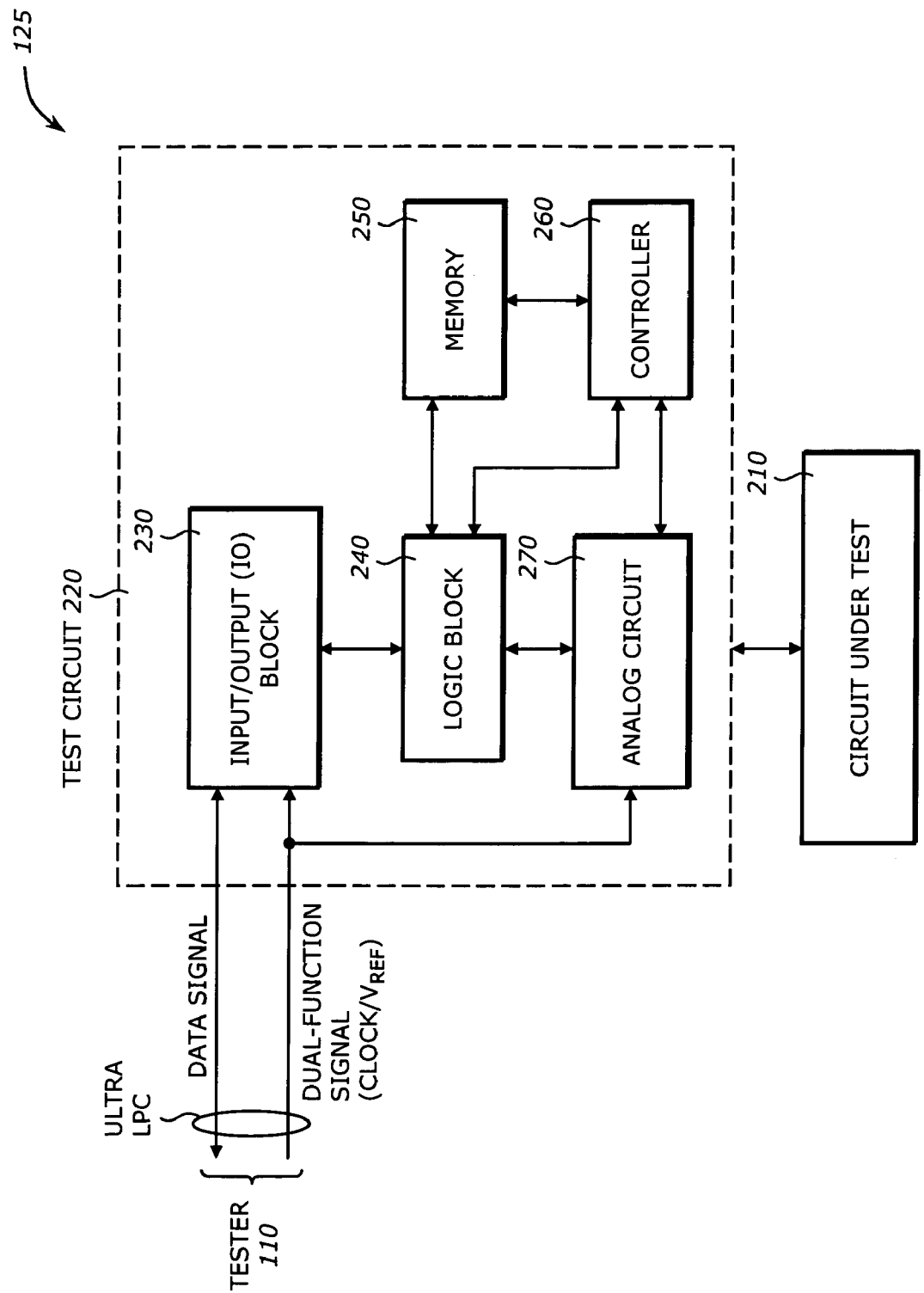
FIG. 2 is a diagram illustrating a die under test according to one embodiment of the invention.

FIG. 2 is a diagram illustrating a die under test 125 shown in FIG. 1 according to one embodiment of the invention. The die under test 125 may be any of the die in any of the DUT groups 120$_1$ to 120$_M$. The die 125 includes a circuit-under-test 210 and a test circuit 220.

The circuit-under-test 210 may be any circuit that is being tested. It may be a flash memory, a Random Access Memory (RAM), a Programmable Read Only Memory (PROM). It may include analog and/or digital circuitry.

The test circuit 220 is a built-in circuit that is designed to test the circuit-under-test 210. It is included as part of the die 125. It includes an I/O block 230, a logic block 240, a memory 250, a controller 260, and an analog circuit 270.

The IO block 230 communicates with the external tester 110 to receive test data and to send test result using first and second communication modes. The first communication mode uses a 2-signal scheme. The second communication mode uses a 1-signal scheme. In one embodiment, the first communication mode uses a synchronous Non Return to Zero (NRZ) scheme and the second communication mode uses a Coded Pulse Width Modulation (CPWM) scheme. Other 2-signal schemes may be used for the first communication mode such as Non Return to Zero Inverted (NRZI), Return to Zero (RZ), Alternate Mask Inversion (AMI), etc. Similarly, other 1-signal schemes may be used for the second communication mode such as Manchester encoding, Bipolar RZ, Asynchronous NRZ, 8b/10b, etc In the 2-signal scheme, the communication uses two signals: the data signal for carrying the test data and the dual-function signal for carrying the clock signal. In the 1-signal scheme, the communication uses only one signal: the data signal for carrying the test data and the clock signal. The dual-function signal is then used as a reference voltage signal, a precision current reference, or a precision voltage input to be used by the analog circuit 270.

The logic block 240 performs a number of logic operations to interact with the I/O block 230, the memory 250, the controller 260, and an analog circuit 270. It may include a number of registers and logic circuits to perform several control tasks including: (1) decoding the test data to obtain commands sent from the tester 110, (2) selecting or switching the communication modes by controlling the I/O block 230, (3) parsing the test data to extract microcode that contains a test program used to test the circuit-under-test 210, (4) transferring or loading the extracted microcode to the memory 250, (5) sending a start execution signal to instruct the controller 260 to begin executing the test program, (6) forwarding the test result stored in the memory 250 to the I/O block 110 to be sent to the tester 110, and (7) responding to status inquiry or polling operation from the tester 110, etc.

The memory 250 stores microcode from the parsed test data transferred or loaded from the logic block 240. The microcode contains a test program to test the circuit under test 210. The memory 250 also contains the test result or data logs after the test program is executed. The test result or data logs may then be sent to the tester 110 when requested by the tester 110. The memory 250 is typically implemented as a static RAM used as a control store for the microcode. The microcode may also be executable by a general-purpose microprocessor. When used to store microcode in a micro-program, the memory 250 may interface to various components in the test circuit 220 for control purposes. For example, a portion of the bit pattern of the microcode may be mapped to control signals to activate or deactivate certain functionalities in the analog circuit 270.

The controller 260 executes the test program in the microcode and may provide the test result. The controller 260 is typically a micro-program controller, a micro-controller, or a general-purpose microprocessor. When it receives a start execution command passed by the logic block 240, it begins executing the test program. After it finishes the test program, it generates a completion status to the logic block 240. The test program may include instructions to read the test results or test data logs and to store these in the memory 250.

The analog circuit 270 performs analog test operations on the circuit under test 210 using the reference voltage signal obtained from the dual-function signal. The analog test operations may include any suitable analog test operations applied to the circuit-under-test 210. Some examples are: measurements of cell threshold voltage, measurements of row and column leakage currents. In general, the analog circuit 270 serves as an on-die parametric measurements unit.

Figure 3:
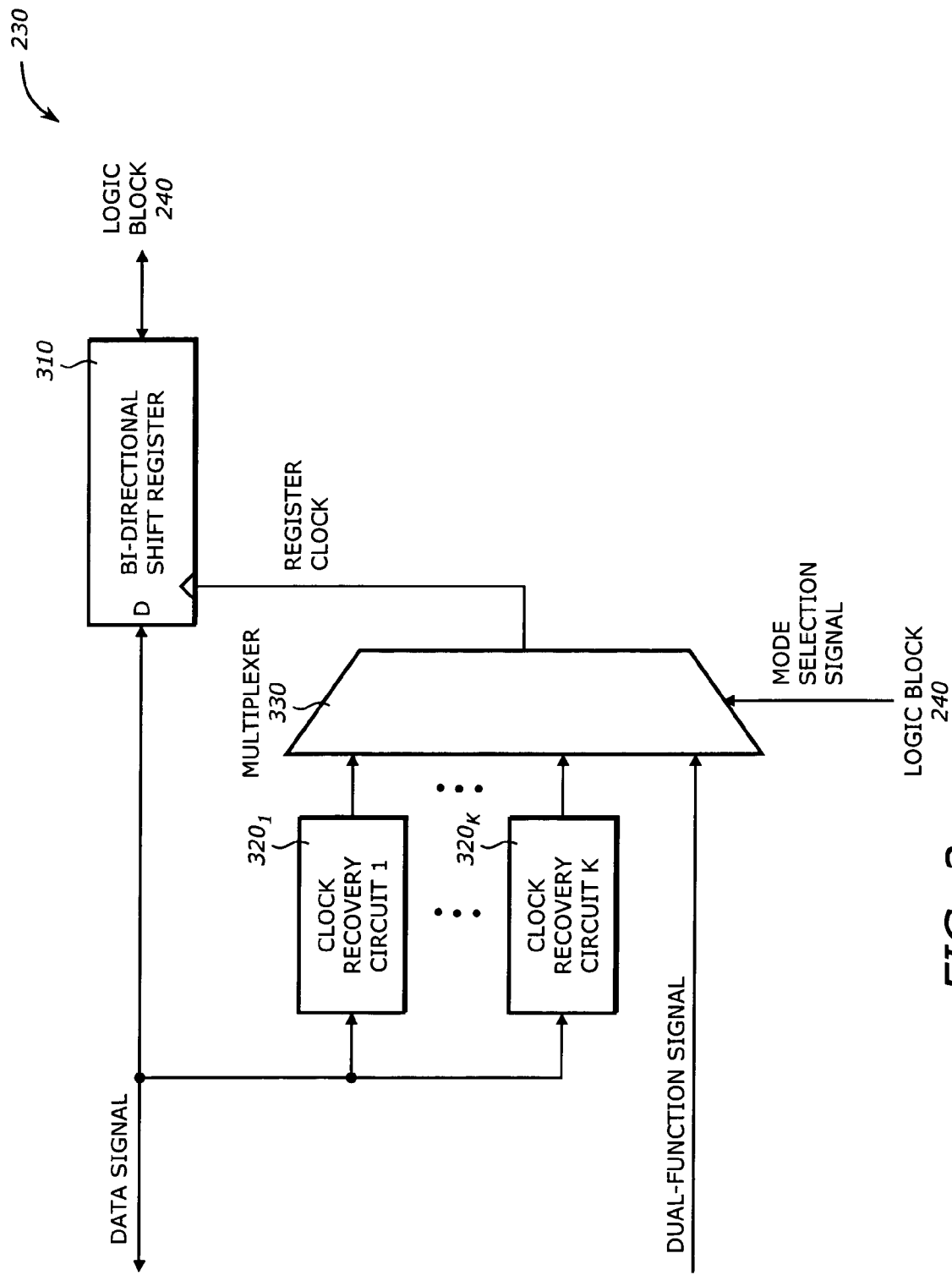
FIG. 3 is a diagram illustrating an I/O block according to one embodiment of the invention.

FIG. 3 is a diagram illustrating the I/O block 230 according to one embodiment of the invention. The I/O block 230 includes a bi-directional shift register 310, K clock recovery circuits 320$_1$ to 320$_K$, and a multiplexer 330.

The bi-directional shift register 310 is connected to the data signal and the logic block 240. It shifts the test data in to the logic block 240 and shifts the test result out from the logic block 240. The test data may be serialized by the tester 110. The test result or data logs may be serialized by the logic block 240. The bi-direction shift register 310 is clocked by the register clock provided by the multiplexer 330.

Each of the clock recovery circuits 320$_1$ to $^{320}{}_K$ recovers a second clock signal from the test data when the test data is transmitted in the second communication mode. In one embodiment, the second communication mode uses a Coded Pulse Width Modulation (CPWM) scheme. In this scheme, both data and clock are embedded in the same data signal. Accordingly, it is necessary to recover or extract the clock from the data signal. K clock recovery circuits 320$_1$ to 320$_K$ are used to provide the flexibility of accommodating various clock rates. For example, the clock frequency may be 20 MHz, 5 MHz, or 1 MHz. The number K depends on the number of clock frequencies the circuit may be able to support. It may be equal to one or any other positive integers.

The multiplexer 330 is connected to the clock recovery circuits 320$_1$ to 320$_K$ and the dual-function signal to provide the register clock to the bi-directional shift register 310. As discussed earlier, the dual-function signal is used as the first clock signal in the first communication mode and a reference voltage signal, a precision current reference, or a precision voltage input in the second communication mode. The multiplexer 330 is controlled by the mode selection signal which is provided by the logic block 240. As will be discussed later, upon receiving a command from the tester 110, the logic block 240 may switch the communication mode by sending the appropriate mode selection signal to the multiplexer 330 to generate the appropriate register clock according to the selected communication mode.

Figure 4:
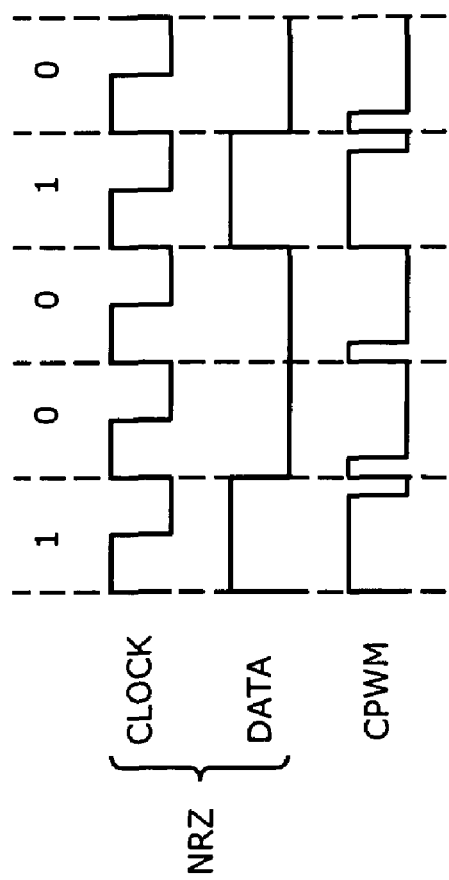
FIG. 4 is a timing diagram illustrating two communication modes according to one embodiment of the invention.

FIG. 4 is a timing diagram illustrating two communication modes according to one embodiment of the invention. The two communication modes include the synchronous NRZ scheme and the CPWM scheme. In this illustrative example, the serial data to be transmitted is 1 0 0 1 0.

The NRZ communication scheme uses two signals: the data and the clock. The data is synchronized with the clock. At the clock edge, the data bit is latched into the shift register 310 (FIG. 3). The data rate or the clock frequency may be any frequency that the tester 110 supports. In one embodiment, the clock frequency may range from 1 MHz to 50 MHz. When the clock frequency is N MHz, the data rate is N Megabits (Mb) per second (Mb/s).

The CPWM uses one signal: the data signal that carries both the clock information and the data. In this scheme, the clock signal is provided as a low-to-high transition. The data signal, therefore, shows a low-to-high transition at every clock edge. The actual data, whether LOW or HIGH, has a shortened width within a clock period to allow for the generation of the low-to-high transitions. Pulses of different widths are used to represent bits 0 and 1. In addition, the number of bits to represent bits 0 or 1 depends of the encoding format. For a 1:P encoding format, P bits are used to encode 0 or 1. The specific bit pattern may be any suitable bit pattern. For example, in the 1:6 encoding format, bit 0 may be encoded as "1 0 0 0 0 0" and bit 1 may be encoded as "1 1 1 1 1 0". The data rate for the CPWM is reduced proportionally according to the encoding format. For example, when the encoding clock is L MHz and the encoding format is 1:P, the CPWM data rate is L/P Mb/s. More than one data rate may be employed.

The timing waveforms for the NRZ and the CPWM shown in FIG. 4 are for illustrative purposes only. They are not intended to show any timing relationships. For example, if the same clock is used, then one bit of CPWM using the 1:P encoding may occupy P clock periods, while the NRZ only occupies one clock period.

The communication between the tester 110 and the DUT groups 120₁ to 120_M may be carried out by transmitting messages as a series of packets. A packet may have a well-defined format to facilitate encoding, decoding, parsing, storage, disassembly, and assembly.

Figure 5:
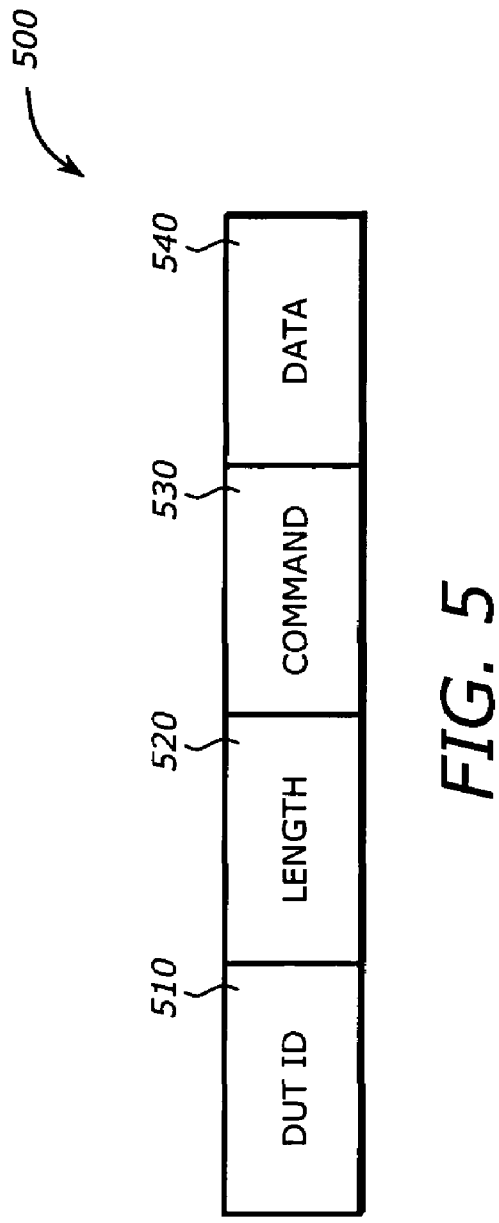
FIG. 5 is a diagram illustrating a packet according to one embodiment of the invention.

FIG. 5 is a diagram illustrating a packet 500 according to one embodiment of the invention. The packet 500 includes a DUT identifier (ID) field 510, a length field 520, a command field 530, and a data field 540.

The DUT ID field 510 contains the ID of the die or device under test 125. The die ID is useful to distinguish one die from another. This is used when test results or data logs are retrieved from the die. In addition, a die in a group may have a different test program from others. Having a die ID helps transmitting/receiving information to/from the appropriate die.

The length field 520 contains a number indicating the length of the packet in terms of bytes. This information may be useful for a recipient to set up loop structure to read the packet and determine when the packet has been completely read or received.

The command field 530 contains a command or instruction sent from the tester 110 to instruct the die 125 to perform a task or operation. There are a number of commands the tester 110 may send to the die 125. Examples of these commands are: (1) switching to the first communication mode, (2) switching to the second communication mode, (3) selecting the communication frequency, (4) executing test program, (5) inquiring or polling completion status, (6) requesting to send test result, and (7) setting a value in a register, etc. As discussed earlier, when the logic block 240 in the test circuit 220 (FIG. 2) receives the test data, it parses the packet to obtain the command and then carries out the corresponding operation or task.

The data field 530 contains the data or arguments. The data may be the microcode to be loaded into the memory 250 (FIG. 2). It may be a value to be stored into an interface register in the logic block 240 or the analog circuit 270.

Figure 6:
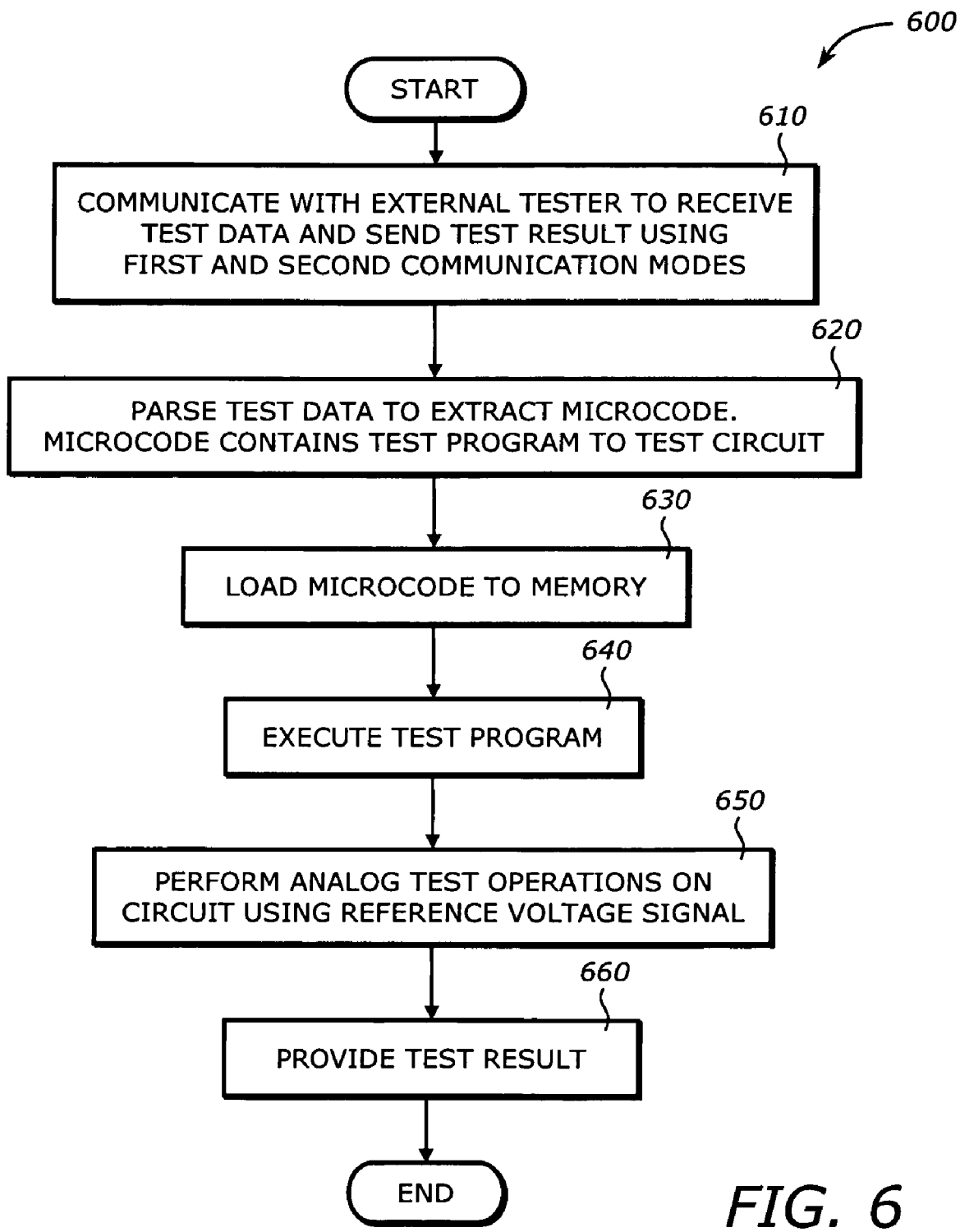
FIG. 6 is a flowchart illustrating a process to test a circuit according to one embodiment of the invention.

FIG. 6 is a flowchart illustrating a process 600 to test a circuit according to one embodiment of the invention.

Upon START, the process 600 communicates with an external tester to receive test data and send test results using first and second communication modes (Block 610). In one embodiment, the first communication mode uses an NRZ scheme and the second communication mode uses a CPWM scheme. Next, the process 600 parses the test data to extract microcode (Block 620). The microcode contains a test program to test a circuit.

Then, the process 600 loads the extracted microcode to a memory (Block 630). Next, the process 600 executes the test program (Block 640). Then, the process 600 performs analog test operations on the circuit using a reference voltage signal, a precision current reference, or a precision voltage input provided by the dual-function signal (Block 650). The analog test operations may include measurements of various circuit parameters such as cell threshold voltage, leakage currents, etc. Next, the process 600 provides the test result to the tester (Block 660). The test result may be stored in the memory to be read by the logic block 240 and send to the tester via the 10 block 230 as shown in FIG. 2. The process 600 is then terminated.

Figure 7:
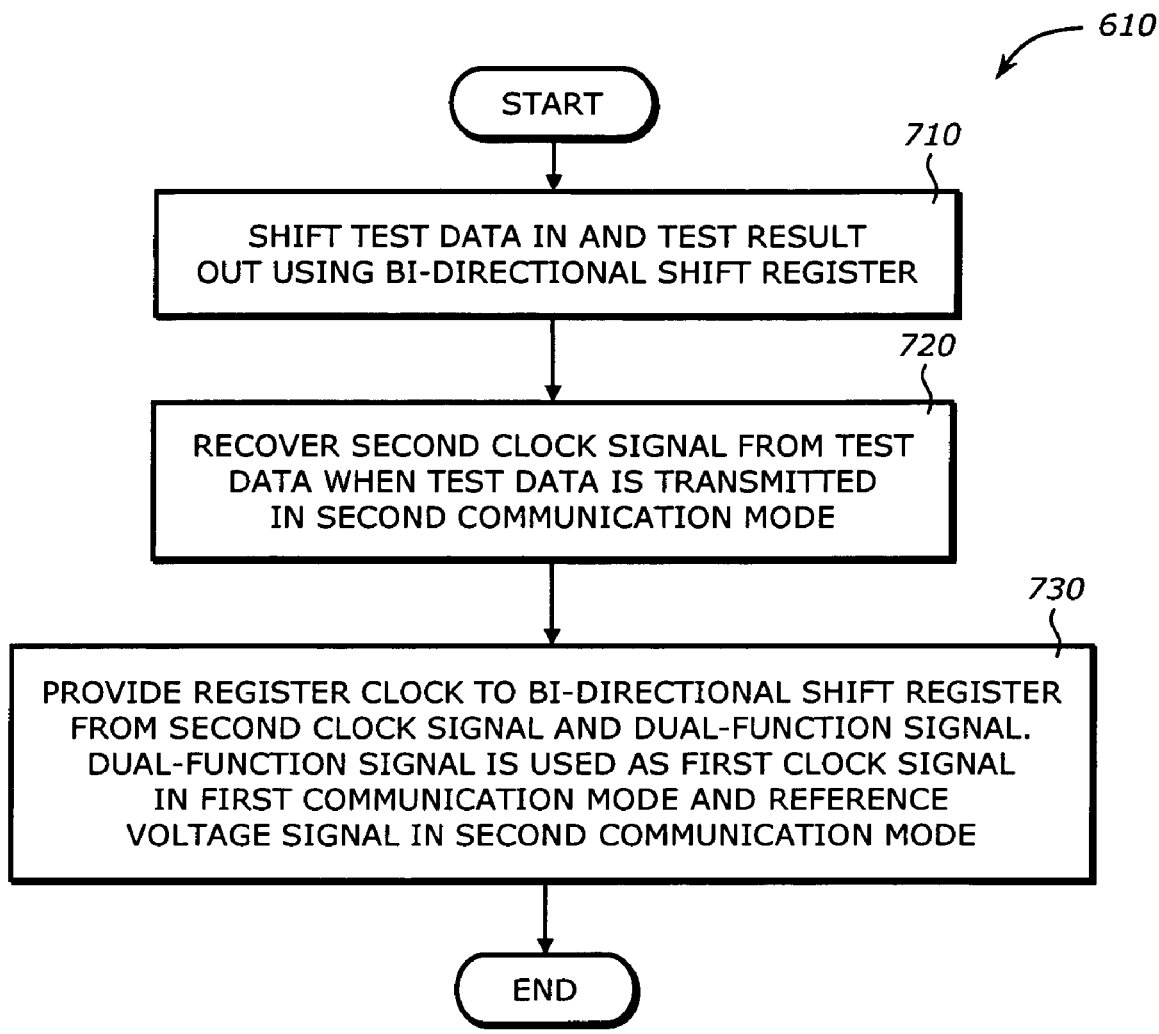
FIG. 7 is a flowchart illustrating a process to communicate with an external tester according to one embodiment of the invention.

FIG. 7 is a flowchart illustrating the process 610 to communicate with an external tester shown in FIG. 6 according to one embodiment of the invention.

Upon START, the process 610 shifts the test data in and the test result out using a bi-directional shift register (Block 710). Next, the process 610 recovers a second clock signal from the test data when the test data is transmitted in the second communication mode (Block 720).

Then, the process 610 provides a register clock to the bi-directional shift register selected from the second clock signal and the dual-function signal (Block 730). The dual-function signal is used as the first clock signal in the first communication mode and a reference voltage signal, a precision current reference, or a precision voltage input in the second communication mode. The process 610 is then terminated.

The MAC layer defines a communication protocol between the tester 110 and the DUT groups 120₁ to 120_M. The communication protocol allows the tester 110 to control the individual die 125_{ij} in each DUT group to configure or set up the communication mode. The tester 110 send commands or data to the die 125_{ij} and the die 125_{ij} decodes the command and carries out the task.

Figure 8:
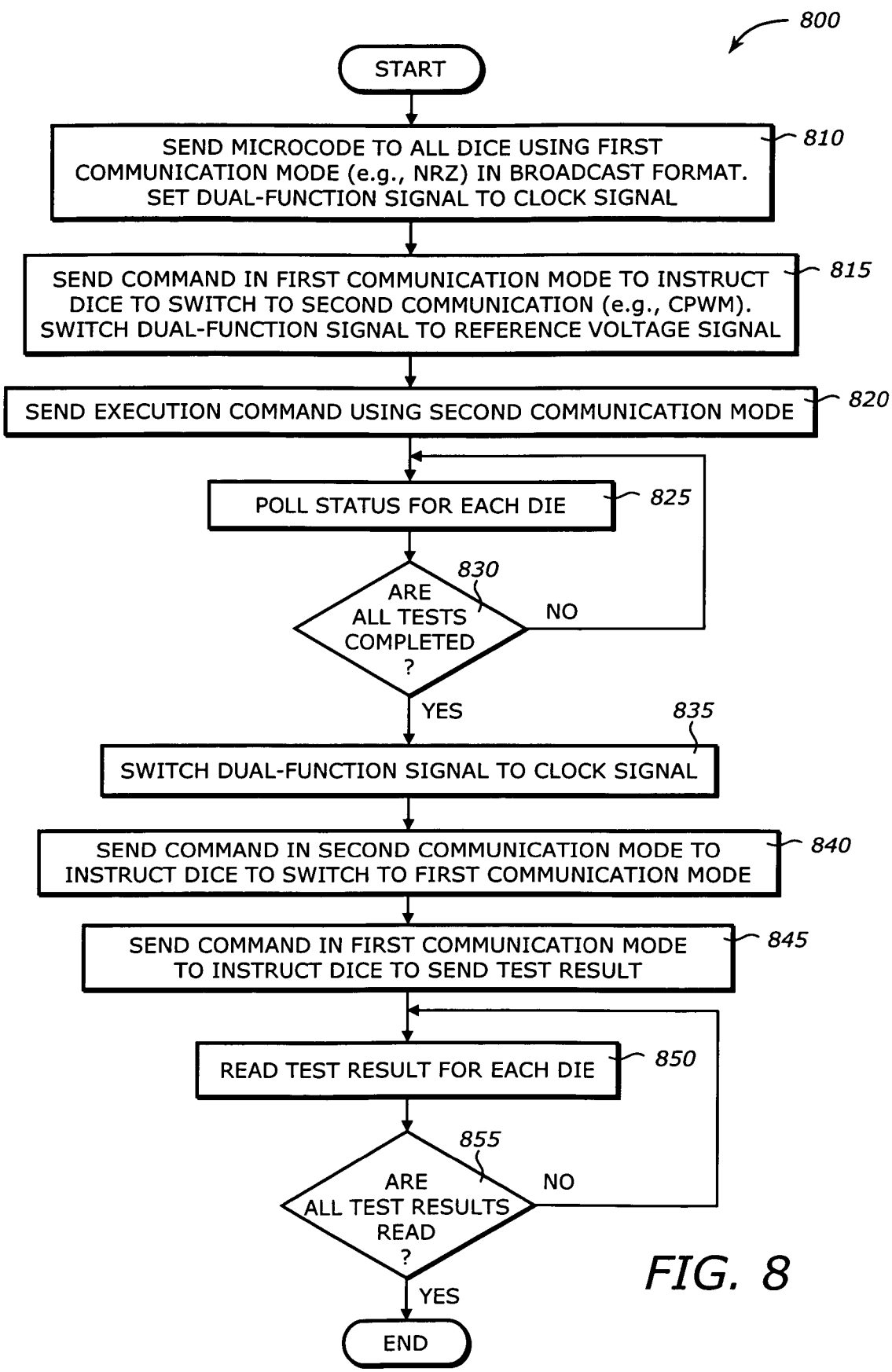
FIG. 8 is a flowchart illustrating a process for a tester to test a DUT group according to one embodiment of the invention.

FIG. 8 is a flowchart illustrating a process 800 for a tester to test a DUT group according to one embodiment of the invention.

Upon START, the process 800 sends the microcode to all dice in the group using the first communication mode (e.g., NRZ scheme) in broadcast format (Block 810). All dice in the group receive the microcode. It is assumed that all dice use the same test program in the microcode. The dual-function signal is set to carry the clock signal for the first communication mode.

Next, the process 800 sends a command in the first communication mode to instruct the dice to switch to the second communication mode (e.g., CPWM) and switches the dual-function signal to a reference voltage signal (Block 815). Then, the process 800 sends an execution command using the second communication mode (Block 820). The execution command instructs the die to start executing the test program in the microcode.

Next, the process 800 polls status from each die to inquire if the test program has been completed (Block 825). Then, the process 800 determines if all tests are completed (Block 830). If not, the process 800 returns to block 825 to continue polling the status. Otherwise, the process 800 switches the dual-function signal to the clock signal for the first communication mode (Block 835).

Then, the process 800 sends a command in the second communication mode to instruct the die to switch to the first communication mode (Block 840). Next, the process 800 sends a command in the first communication mode to instruct the dice to send the test result (Block 845). Then, the process 800 reads the test result for each die (Block 850). Next, the process 800 determines if all the test results have been read (Block 855). If not, the process 800 returns to block 850 to continue reading the test results. Otherwise, the process 800 is terminated.

Figure 9:
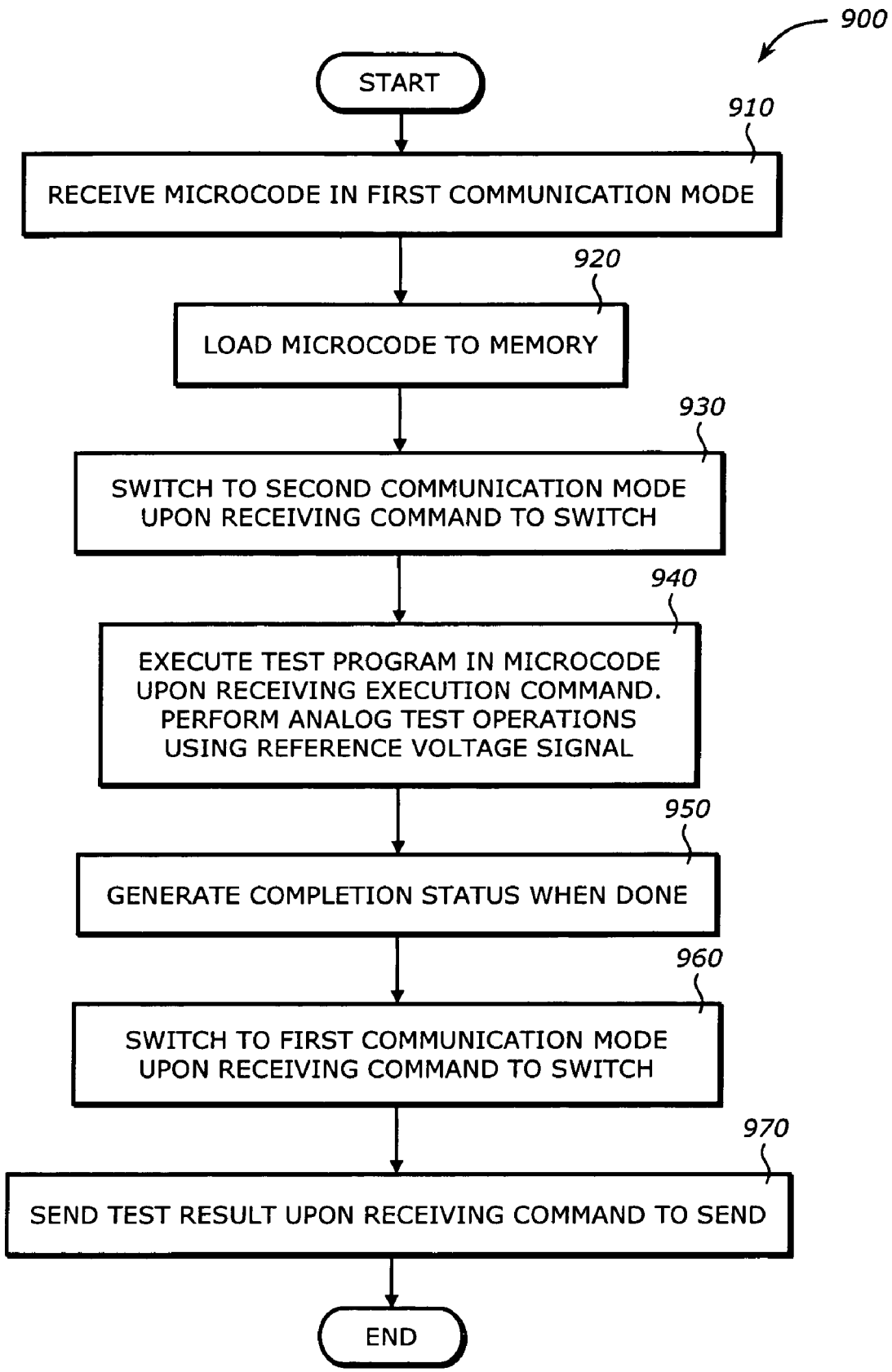
FIG. 9 is a flowchart illustrating a process for a built-in test circuit to test a circuit under test according to one embodiment of the invention.

FIG. 9 is a flowchart illustrating a process 900 for a built-in test circuit to test a circuit under test according to one embodiment of the invention.

Upon START, the process 900 receives the microcode sent by the tester in the first communication mode (Block 910). Next, the process 900 loads the microcode to the memory (Block 920). Then, the process 900 switches to the second communication mode upon receiving the command to switch (Block 930).

Next, the process 900 executes the test program in the microcode upon receiving an execution command. The process 900 also performs analog test operations using the reference voltage or current signal carried by the dual-function signal (Block 940). Then, the process 900 generates a completion status when the test program is finished (Block 950).

Next, the process 900 switches to the first communication mode upon receiving a command to switch (Block 960). Then, the process 900 sends the test result upon receiving a command to send (Block 970). Then, the process 900 is terminated.

The use of the ULPC interface reduces the pin count significantly. This reduces test interface requirements, the sort test cost and increases test reliability. By sharing the 2 pins among multiple dice in a DUT group further reduction of overall I/O resources for the ATE-DFT test interface. In addition, the communication protocol in MAC layer may be used for any serial communication applications other than testing.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   an input/output (I/O) block to communicate with an external tester to receive test data and to send test result using first and second communication modes;
   a logic block coupled to the I/O block to parse the test data;
   a memory coupled to the logic block to store microcode from the parsed test data, the microcode containing a test program to test a circuit; and
   a controller coupled to the memory and the logic block to execute the test program.

2. The apparatus of claim 1 wherein the I/O block comprises:
   a bi-directional shift register to shift the test data in and to shift the test result out;
   a clock recovery circuit to recover a second clock signal from the test data when the test data is transmitted in the second communication mode; and
   a multiplexer coupled to the clock recovery circuit and a dual-function signal to provide a register clock to the bi-directional shift register, the dual-function signal being used as a first clock signal in the first communication mode and a reference voltage signal, a precision current reference, or a precision voltage input in the second communication mode.

3. The apparatus of claim 2 further comprising:
   an analog circuit coupled to the I/O block and the controller to perform analog test operations on the circuit using the reference voltage signal, the precision current reference, or the precision voltage input.

4. The apparatus of claim 1 wherein the first communication mode is a synchronous non-return-to-zero (NRZ) mode and the second communication mode is a coded pulse width modulation (CPWM) mode.

5. The apparatus of claim 4 wherein the test data includes a data packet having a die identifier (ID) field, a packet length field, a command field, and a data field.

6. The apparatus of claim 5 wherein the command field includes a command, the command being one of a microcode write command, a test result read command, and a logic block interface command.

7. The apparatus of claim 1 wherein the first communication mode is used to transmit the microcode and to read the test result.

8. The apparatus of claim 1 wherein the second communication mode is used to poll status.

9. A method comprising:
   communicating with an external tester to receive test data and to send test result using first and second communication modes;
   parsing the test data to extract microcode, the microcode containing a test program to test a circuit;
   loading the microcode to a memory;
   executing the test program; and
   providing the test result.

10. The method of claim 9 communicating comprises:
    shifting the test data in and the test result out using a bi-directional shift register;
    recovering a second clock signal from the test data when the test data is transmitted in the second communication mode; and
    providing a register clock to the bi-directional shift register from the second clock signal and a dual-function signal, the dual-function signal being used as a first clock signal in the first communication mode and a reference voltage signal, a precision current reference, or a precision voltage input in the second communication mode.

11. The method of claim 10 further comprising:
    performing analog test operations on the circuit using the reference voltage signal, the precision current reference, or the precision voltage input.

12. The method of claim 9 wherein the first communication mode is a synchronous non-return-to-zero (NRZ) mode and the second communication mode is a coded-pulse-width-modulation (CPWM) mode.

13. The method of claim 12 wherein the test data includes a data packet having a die identifier (ID) field, a packet length field, a command field, and a data field.

14. The method of claim 13 wherein the command field includes a command, the command being one of a microcode write command, a test result read command, and a logic block interface command.

15. The method of claim 9 further comprising transmitting the microcode and reading the test result using the first communication mode.

16. The method of claim 9 further comprising polling status using the second communication mode.

17. A system comprising:
    a tester; and
    a device under test (DUT) group coupled to the tester and having a plurality of dice, each of the dice having an ultra low pin count (ULPC) interface including a data signal and a dual-function signal, each of the dice comprising:
- an input/output (I/O) block to communicate with the tester to receive test data and to send test result on the data signal using first and second communication modes,
- a logic block coupled to the I/O block to parse the test data,
- a memory coupled to the logic block to store microcode from the parsed test data, the microcode containing a test program to test a circuit, and
- a controller coupled to the memory and the logic block to execute the test program.

18. The system of claim 17 wherein the I/O block comprises:
- a bi-directional shift register to shift the test data in and to shift the test result out;
- a clock recovery circuit to recover a second clock signal from the test data when the test data is transmitted in the second communication mode; and
- a multiplexer coupled to the clock recovery circuit and a dual-function signal to provide a register clock to the bi-directional shift register, the dual-function signal being used as a first clock signal in the first communication mode and a reference voltage signal, a precision current reference, or a precision voltage input in the second communication mode.

19. The system of claim 18 wherein each of the dice further comprises:
- an analog circuit coupled to the I/O block and the logic block to perform analog test operations on the circuit using the reference voltage signal, the precision current reference, or the precision voltage input.

20. The system of claim 17 wherein the first communication mode is a synchronous non-return-to-zero (NRZ) mode and the second communication mode is a coded pulse width modulation (CPWM) mode.

21. The system of claim 20 wherein the test data includes a data packet having a die identifier (ID) field, a packet length field, a command field, and a data field.

22. The system of claim 21 wherein the command field includes a command, the command being one of a microcode write command, a test result read command, and a logic block interface command.

23. The system of claim 17 wherein the first communication mode is used to transmit the microcode and to read the test result.

24. The system of claim 17 wherein the second communication mode is used to poll status.

* * * * *